United States Patent
Brun et al.

(10) Patent No.: US 9,743,517 B2
(45) Date of Patent: Aug. 22, 2017

(54) PROCESS FOR MANUFACTURING AN ELECTRICALLY CONDUCTIVE MEMBER FOR AN ELECTRONIC COMPONENT COMPRISING AN END EQUIPPED WITH A CAVITY

(71) Applicant: COMMISSARIAT A L'ENERGIE ATOMIQUE ET AUX ENERGIES ALTERNATIVES, Paris (FR)

(72) Inventors: Jean Brun, Champagnier (FR); Abdelhak Hassaine, Grenoble (FR); Jean-Marie Quemper, Saint-Martin-le-Vinoux (FR); Régis Taillefer, Le Versoud (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 274 days.

(21) Appl. No.: 14/533,659

(22) Filed: Nov. 5, 2014

(65) Prior Publication Data
US 2015/0131251 A1   May 14, 2015

(30) Foreign Application Priority Data

Nov. 8, 2013 (FR) .................................... 13 60934

(51) Int. Cl.
*H05K 1/11* (2006.01)
*C23C 14/04* (2006.01)
(Continued)

(52) U.S. Cl.
CPC ............ *H05K 1/111* (2013.01); *C23C 14/046* (2013.01); *C25D 7/00* (2013.01); *H01B 13/0026* (2013.01);
(Continued)

(58) Field of Classification Search
CPC ...... H05K 1/111; H05K 1/181; C23C 14/046; C25D 7/00; H01B 13/0026; H01L 23/49811; H01L 2924/0002; Y10T 156/10
(Continued)

(56) References Cited

U.S. PATENT DOCUMENTS

| 5,929,521 A | 7/1999 | Wark et al. |
| 6,198,161 B1 | 3/2001 | Koshio |

(Continued)

FOREIGN PATENT DOCUMENTS

| FR | 2 928 033 A1 | 8/2009 |
| FR | 2 967 296 A1 | 5/2012 |

OTHER PUBLICATIONS

European Search Report and Written Opinion dated May 12, 2015, issued in counterpart European Patent Application No. 14191483.8; with English partial translation and partial machine translation (9 pages).

(Continued)

*Primary Examiner* — Eric Thomas
*Assistant Examiner* — Michael P McFadden
(74) *Attorney, Agent, or Firm* — Westerman, Hattori, Daniels & Adrian, LLP

(57) ABSTRACT

This process for manufacturing an electrically conductive member for an electronic component comprises the following steps: providing a structure comprising at least one blind hole having a bottom and at least one internal lateral flank connected to said bottom via a base of said lateral flank; forming the member, this forming step comprising a step of growing an electrically conductive material in order to form at least one portion of the member in the blind hole, said growth being faster at the base of the lateral flank of the blind hole than on the rest of said lateral flank, said member when formed comprising a cavity arranged at that end of (Continued)

said member which is located opposite the bottom of the blind hole, said cavity being entirely or partially bordered by a rim.

18 Claims, 5 Drawing Sheets

(51) Int. Cl.
  *H01B 13/26* (2006.01)
  *H05K 1/18* (2006.01)
  *C25D 7/00* (2006.01)
  *H01B 13/00* (2006.01)
  *H01L 23/498* (2006.01)
  *H01L 21/48* (2006.01)

(52) U.S. Cl.
  CPC .... *H01L 21/4853* (2013.01); *H01L 23/49811* (2013.01); *H05K 1/181* (2013.01); *Y10T 156/10* (2015.01)

(58) Field of Classification Search
  USPC .......................................................... 361/767
  See application file for complete search history.

(56) References Cited

U.S. PATENT DOCUMENTS

| | | | |
|---|---|---|---|
| 6,320,127 B1 * | 11/2001 | Nagarajan | H01L 21/563 174/557 |
| 6,683,387 B1 * | 1/2004 | Brownfield | H01L 23/49811 257/778 |
| 7,944,028 B2 * | 5/2011 | Saunders | H01L 21/4853 257/666 |
| 2011/0001237 A1 * | 1/2011 | Brun | H01L 21/6835 257/737 |
| 2011/0094789 A1 | 4/2011 | Marion et al. | |
| 2011/0149540 A1 * | 6/2011 | Brun | G06K 19/077 361/783 |
| 2013/0001767 A1 | 1/2013 | Kajiki | |
| 2013/0100626 A1 | 4/2013 | Inoue et al. | |
| 2013/0267113 A1 | 10/2013 | Marion et al. | |

OTHER PUBLICATIONS

French Search Report dated Feb. 20, 2014 issued in corresponding application No. FR1360934, and written opinion; with English partial translation and partial machine-translation.
European Search Report dated May 12, 2015 in corresponding application No. EP14191483, and written opinion; with English partial translation and partial machine-translation (10 pages).

* cited by examiner

PROCESS FOR MANUFACTURING AN ELECTRICALLY CONDUCTIVE MEMBER FOR AN ELECTRONIC COMPONENT COMPRISING AN END EQUIPPED WITH A CAVITY

TECHNICAL FIELD OF THE INVENTION

The invention relates to the field of electronics and more particularly to connections in the field of microelectronics.

In particular, one subject of the invention relates to a process for manufacturing an electrically conductive member for an electronic component.

PRIOR ART

In the context of the interconnection of electronic elements, it is known to use penetrating pads that promote a good electrical contact with a corresponding electrically conductive element.

In this respect, document FR 2 967 296 describes a connection system using a male member and a female member. Although effective, this connection system requires a high precision during the coupling of the male member with the female member if deterioration of one of said members is to be avoided.

Document FR 2 928 033 is an alternative in which an insert is formed by a hollow cylinder cut with a bevel in order to facilitate its penetration into a third member while preventing air from being trapped. The same problem mentioned regarding document FR 2 967 296 applies.

Furthermore, the quality of the manufacturing processes of the connection systems described above is difficult to control because of the fragility of the insert or member.

SUBJECT OF THE INVENTION

The aim of the present invention is to provide a simple process for manufacturing a member that is electrically conductive and more resistant to mechanical stresses.

This aim is at least partially obtained by virtue of a process for manufacturing an electrically conductive member for an electronic component, said process comprising the following steps: providing a structure comprising at least one blind hole having a bottom and at least one internal lateral flank connected to said bottom via a base of said lateral flank; forming the member, this forming step comprising a step of growing an electrically conductive material in order to form at least one portion of the member in the blind hole, said growth being faster at the base of the lateral flank of the blind hole than on the rest of said lateral flank, said member when formed comprising a cavity arranged at that end of said member which is located opposite the bottom of the blind hole, said cavity being entirely or partially bordered by a rim.

For example, the growth step involves an electrolysis step or a chemical deposition step.

According to one embodiment, the step of providing the structure comprising said at least one blind hole comprises the following steps: providing a substrate; forming a mask on the substrate so that said mask bounds with said substrate said at least one blind hole.

According to one particular embodiment, all or some of the bottom of the blind hole, and/or at least the base of the lateral flank are formed by a material, especially taking the form of a layer, apt to promote said growth.

For example, the bottom of the blind hole, at least in a central portion, is formed by a layer of a material that prevents said growth.

Advantageously, the bottom of the blind hole is formed by a material apt to enable the member to be grown by electrolysis, and the step of forming the member comprises, before the growth step, a step of sputtering some of the material apt to enable the member to be grown by electrolysis onto at least the base of the internal lateral flank of the blind hole, and the growth step is carried out by electrolysis after the sputtering step.

The sputtering step may comprise applying a plasma or carrying out ion etching.

Advantageously, the electrolysis step is based on nickel or gold or copper or tin or an alloy of at least two of these metals.

Preferably, the step of forming the member comprises, after the portion of the member has been grown, a step of forming a stack of one or more layers on said portion of the member in order to form the rest of said member in such a way that the top of the stack bounds said cavity.

The process may furthermore comprise a step of freeing the member, comprising removing all or some of the structure.

The invention also relates to an electronic component comprising a carrier and an electrically conductive member equipped with a first end and a second end opposite the first end, said second end comprising a cavity, said member extending from the carrier starting from its first end in a direction opposite to said carrier, said carrier being equipped with an electronic chip, the member forming an electrical connection pad that is electrically connected to the chip especially via the first end of said member.

The member is especially equipped with a solid body extending between the first end and the bottom of the cavity, the body having a height of at least 10% of the maximum total height of the member, and a rim borders all or some of the cavity.

According to one embodiment of the component, said rim has a bevelled shape.

For example, said rim comprises at least two opposite and preferably substantially parallel side sections.

In particular, the rim comprises an edge forming a ring entirely contained in a plane.

The second end of the member especially makes electrical contact with an electrically conductive element.

Advantageously, the electrically conductive element is penetrated by all or some of the rim so as to ensure electrical contact with said corresponding member.

The component especially comprises a groove for anchoring an electrically conductive wire element, and the member extends starting from its first end from a first side wall of the groove formed by a portion of the carrier, said second end of the member facing a second side wall of the anchoring groove.

BRIEF DESCRIPTION OF THE DRAWINGS

Other features and advantages of the invention will become more clearly apparent from the following description of particular embodiments thereof given by way of nonlimiting example and illustrated in the appended drawings, in which.

DESCRIPTION OF PREFERRED EMBODIMENTS OF THE INVENTION

The process for manufacturing an electrically conductive member for an electronic component such as described below differs from the prior art especially in that it allows a member having a better stability to be obtained rapidly. As a result, the member is less fragile and there is less risk that it will break when it is stressed and especially during penetration into another member or element.

In particular, such a process may comprise a step in which a structure 1000 comprising at least one (or more) blind hole(s) 1001 is provided (FIGS. 1 to 5).

A blind hole 1001 comprises a bottom 1002a and at least one internal lateral flank 1002b connected to said bottom 1002a by a base of said at least one lateral flank 1002b.

The lateral flank 1002b in fact extends from the bottom 1002a in the direction of an aperture of the blind hole 1001, said aperture being located opposite said bottom 1002a. For a blind hole 1001, the lateral flank 1002b may in fact correspond to the internal surface of the blind hole, said surface extending from the bottom 1002a of the blind hole as far as its aperture. The bottom 1002a of the blind hole 1001 may be bounded by a planar or nonplanar surface.

The process furthermore comprises a step of forming the member 1 (shown by dotted lines in FIG. 1) from said at least one blind hole 1001. In fact, the process may also allow a plurality of members to be produced and, consequently, when the structure comprises a plurality of blind holes 1001, each blind hole 1001 allowing a corresponding member 1 to be formed, everything that applies to forming one member in the present description may be applied to form, preferably simultaneously, a plurality of members when the structure provided comprises a plurality of blind holes 1001.

In this respect, the step of forming the member comprises a step of growing an electrically conductive material in order to form at least one portion of the member 1 in the blind hole 1001, said growth being faster at the base of the lateral flank 1002b of the blind hole 1001 than on the rest of said flank 1002b. The member when formed especially comprises a cavity arranged at that end of said member which is located opposite the bottom 1002a of the blind hole 1001, said cavity being entirely or partially bordered by a rim.

The term "cavity" is preferably understood to mean a recessed zone located at one external end of the member, this recess being entirely or partially bordered by a rim.

The term "rim" is understood to mean a portion protruding from a corresponding portion of the member and bounding said cavity. This rim is preferably bevelled.

Figure 7:
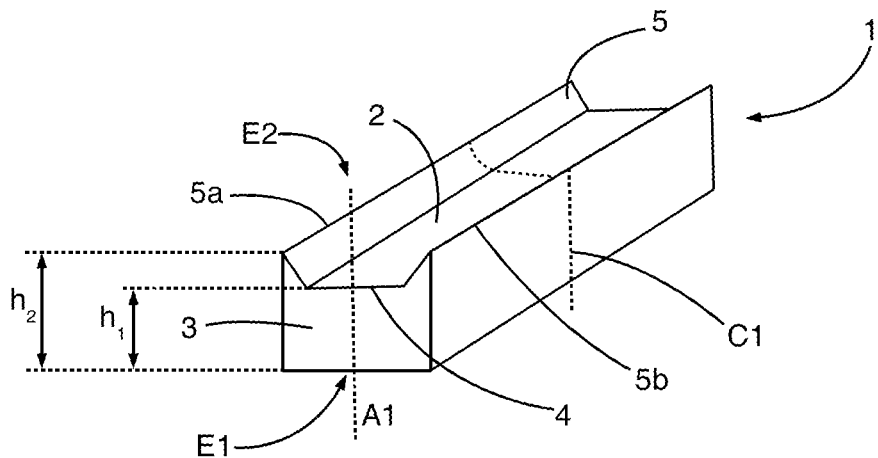
FIGS. 7 to 9 are perspective views of members according to various embodiments of the invention.
Figure 8:
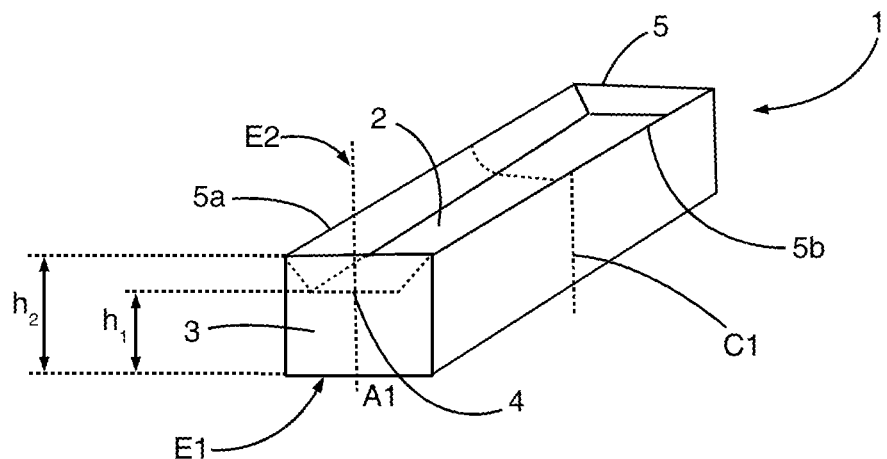
Figure 9:
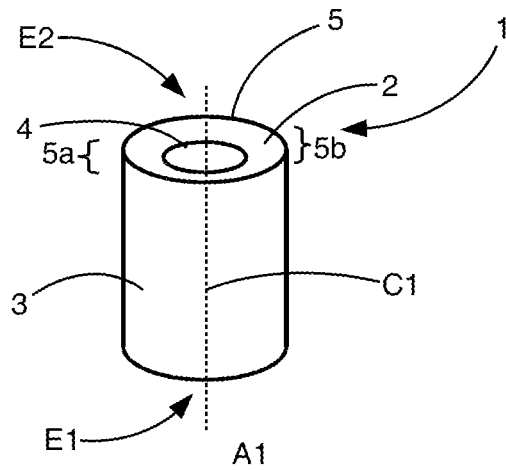
Figure 10:
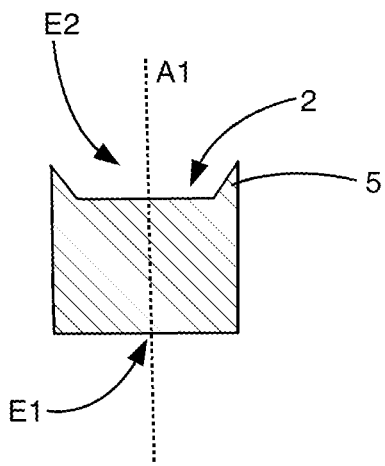
FIG. 10 illustrates a cross section along C1 in FIGS. 7 to 9.

FIGS. 7 to 9 illustrate an electrically conductive member 1 equipped with a cavity 2. In FIGS. 7 to 9, a body 3 of the member partially bounds a bottom 4 of the cavity from which a rim 5 extends.

According to one particular implementation, the growth step involves an electrolysis/electrodeposition step or a chemical (also referred to as "electroless") deposition step. The electrolysis step may be based on nickel or gold or copper or tin or an alloy of at least two of these metals or on CuAgSn. Lead and platinum may also be suitable.

In this specification the electrolysis can be an electrodeposition.

By way of example, electrolysis from gold may be carried out with a current density of 0.009 A/cm$^2$, and for nickel, once a first layer has been produced, with a current density of 0.007 A/cm$^2$.

According to one particular embodiment (FIGS. 2A to 6B), the step of providing the structure 1000 comprising said at least one blind hole 1001 comprises a step of providing a substrate 1003 and a step of forming a mask 1004 on the substrate 1003 so that said mask 1004 bounds with said substrate 1003 said at least one blind hole 1001.

Figure 1:
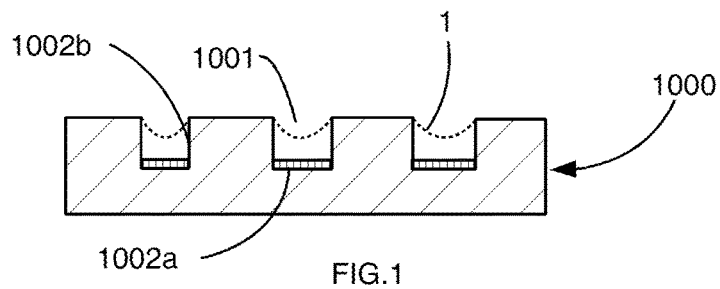
FIGS. 1, 2A, 2B, 3, 4, 5, 6A and 6B illustrate various steps of various processes for manufacturing the member.
Figure 2A:
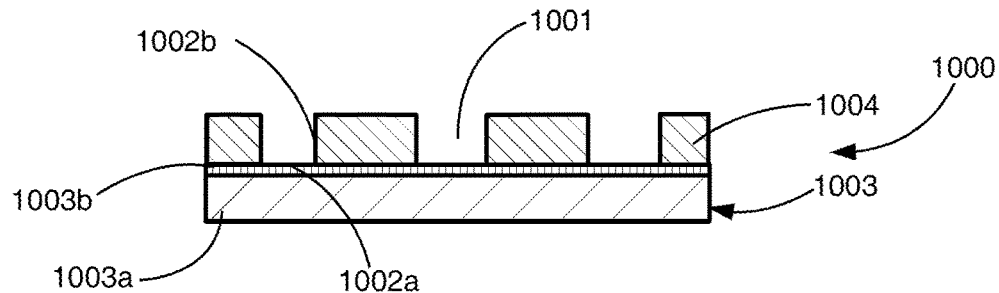
Figure 2B:
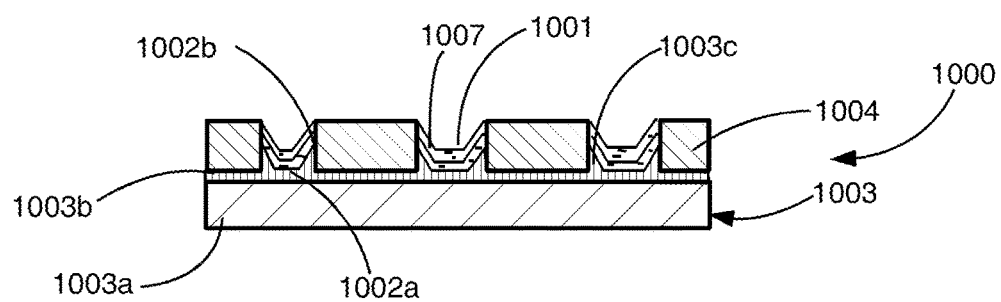

According to a first variant of the step of providing the structure 1000, illustrated in FIGS. 2A and 2B, the substrate 1003 may comprise a silicon layer 1003a on which a layer 1003b of a material apt to enable the member 1 to be grown rests (this material possibly being the electrolysis seed material used above). The mask 1004, preferably containing preformed holes, is deposited/formed on the layer 1003b so as to bound one or more blind holes 1001 the preferably plane bottom 1002a of which is made of the material apt to enable the member 1 to be grown. Alternatively, the mask 1004 is formed directly on the layer 1003b of the substrate 1003 by photolithography of a positive resist, for example in a 20 μm-thick layer of THB820. The thickness of the layer 1003b may be comprised between 100 Å and 2000 Å or may be as much as a few microns.

Figure 3:
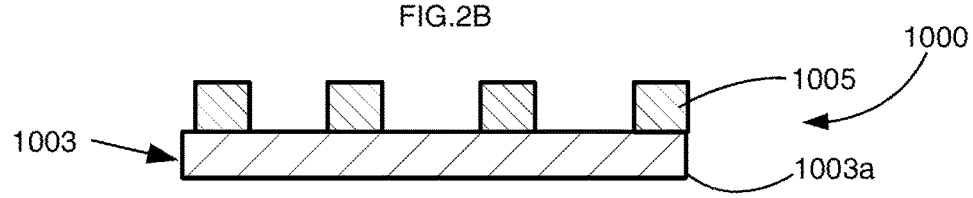
Figure 4:
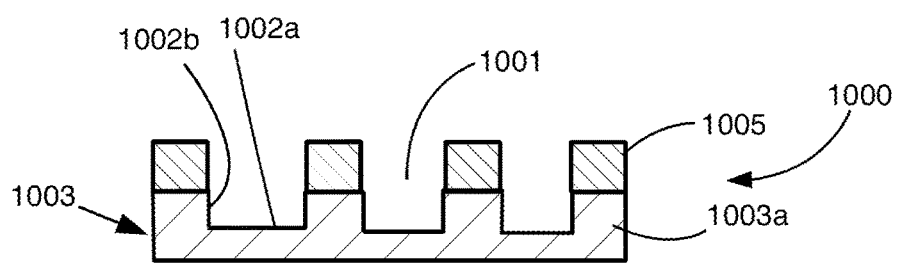
Figure 5:
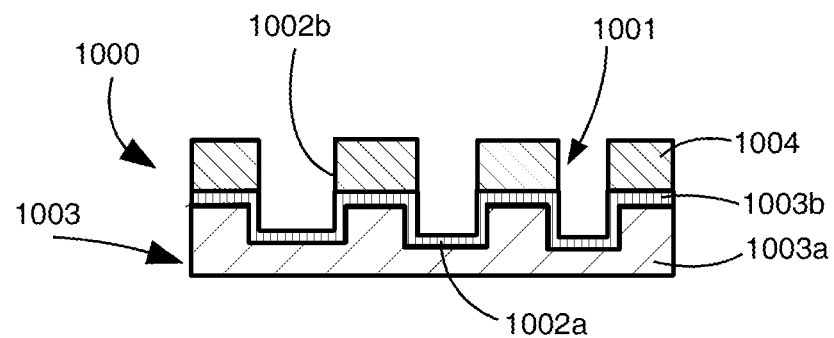

According to a second variant illustrated in FIGS. 3 to 5, the process begins with a silicon layer 1003a on which a first sacrificial mask 1005 (especially of photoresist) is formed by photolithography, forming one or more intermediate blind holes with the silicon layer 1003a. An etching step (FIG. 4) then allows each of the intermediate blind holes to be extended into the silicon layer 1003a. Next, the sacrificial first mask 1005 is removed and a layer 1003b of the material apt to enable the member 1 to be grown is deposited by conformal deposition so as to cover the blind holes formed (FIG. 5) in the silicon layer 1003a. Lastly, a mask 1004 is formed (FIG. 5) so that each blind hole 1001 has its bottom 1002a and the base of its lateral flank 1002b formed by the material apt to enable the member 1 such as described to be grown. In other words, the material 1003b forms the bottom 1002a and extends in the direction of the aperture of the blind hole 1001.

Thus, generally, all or some of the preferably planar bottom 1002a of the blind hole and/or at least the base of the lateral flank 1002b are formed by a material 1003b (especially taking the form of a layer) apt to promote the growth of said member. This especially allows the growth of the member 1 to be carried out in such a way that it is faster at the base of the lateral flank than on the rest of said lateral flank. The expression "promote the growth" is understood to mean that the growth is faster, if possible only, in the locations where said material 1003b is present. It will be understood from what has been said above that preferably at least one portion of the internal surface of the blind hole, especially formed by a portion of the lateral flank 1002b, is not formed by said growth-promoting material.

In the present description, the material apt to promote the growth is advantageously chosen from gold or copper or silver or palladium. Generally, a material that is easily resputterable will be chosen with a view to creating a gradient in the thickness of the material apt to promote growth in the blind hole (the thickness of the material will be greatest at the base of the lateral flank of the blind hole, in a direction perpendicular to the axis of the hole).

According to one particular embodiment, the step of forming the member 1 preferably comprises the following steps in succession: applying a plasma, preferably an oxygen plasma, or carrying out ion etching at grazing incidence, so as to modify the properties of the blind hole 1001 (especially the properties of its bottom 1002*a*), and an electrolysis of nickel in order to grow the member in the blind hole 1001. This step of forming the member is preferably used in the context of the first variant of the step of providing the structure 1000 (FIG. 2A).

The oxygen plasma may also be replaced by plasmas of other reactive gases such as $SF_6$.

In fact, the oxygen plasma sputters (or resputters in the case where the material apt to promote the growth was deposited beforehand by sputtering) the bottom 1002*a* of the blind hole 1001 in order to form, on the base of the lateral flank 1002*b* of the blind hole 1001, a conductive deposition based on metal originating from the material apt to promote the growth of the member and thus to form a gradient in the thickness of said material. In most cases, the deposition gets thicker (and therefore more conductive) closer to the surface of the matrix (the bottom 1002*a* forming the matrix). With distance from the matrix the deposition becomes thinner and thinner and may form single islands. According to one particular method of implementing the step of applying the oxygen plasma in a suitable piece of equipment such as for example a NEXTRAL330, the following conditions are used:

Power: 250 W
Gases used: $O_2$ at 140 sccm and Ar at 20 sccm
Pressure: 100 mTorr
Length: 30 seconds.

Next, during the electrolysis consecutive to the oxygen plasma, the metal residues sputtered onto the flank of the blind hole are electrically connected to the bottom of the blind hole. The electrolytic deposition rate is then proportional to the amount of current that passes. As the metal residues do not have a uniform resistance, since they are more conductive at the bottom than at the top, the growth rate will then decrease with distance from the matrix so as to form naturally the rim and the associated cavity. Next, when the metal is thick enough, the growth rate of the deposition is conformal to the base surface and the initial shape is preserved throughout the growth.

Figure 6A:
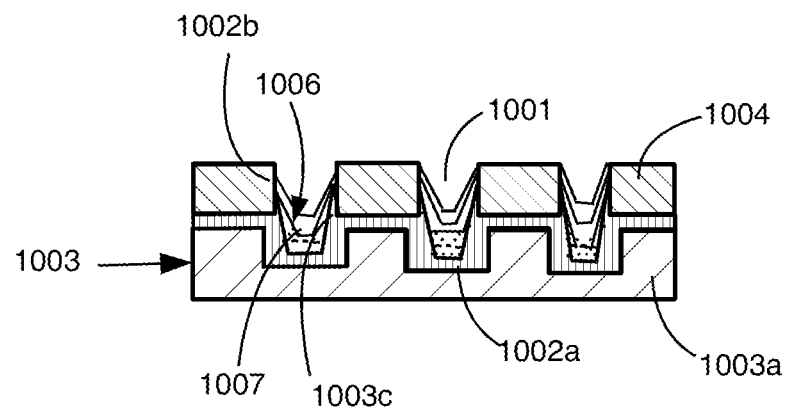
Figure 6B:
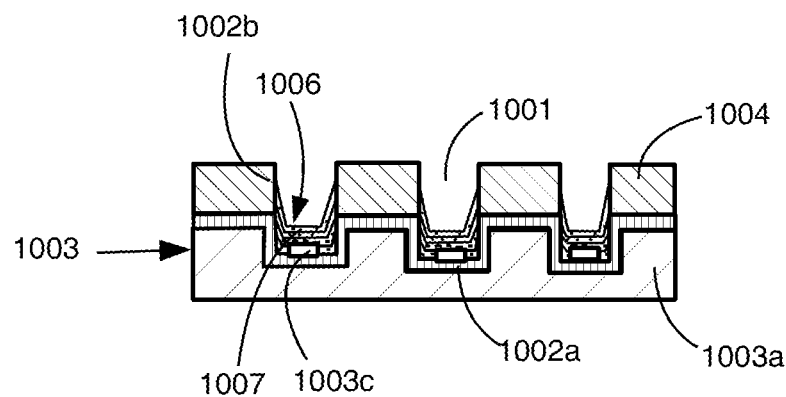

According to one alternative shown in FIG. 6B and implementing ion etching at grazing incidence, the latter allows an insulating material 1003*c*, advantageously originating from the flank of the mask 1004 defining the shape of the hole, to be sputtered (or said insulating material to be resputtered in the case where the mask was obtained beforehand by sputtering) the sputtered material being deposited on a central portion of the bottom of the blind hole. This ion etching is for example carried out with argon or oxygen. A relatively porous insulating residue having a thickness gradient forms in the centre of the bottom of the blind hole (larger thickness at the centre of the residue than at its periphery), leading to an electrically conductive zone on the periphery of the bottom. In the case of ion etching, since electrolysis preferentially initiates from conductive surfaces, deposition will commence on the periphery of the bottom of the blind hole, then, as, starting with the thinnest regions, the porous residue breaks up during the electrolysis, the material grows from the periphery of the bottom of the blind hole and gradually extends towards the centre, thus leading to a nonuniform electrolytic growth.

More generally, when the bottom 1002 of the blind hole 1001 is formed by a material apt to enable the member to be grown by electrolysis, the step of applying the plasma or carrying out the ion etching may be generalized in that the step of forming the member comprises, before the growth step, a step of sputtering some of the material apt to enable the member to be grown by electrolysis (especially by electrolysis of nickel) onto at least the base of the internal lateral flank 1002*b* of the blind hole 1001, and the growth step is carried out by electrolysis (especially by electrolysis of nickel) after the sputtering step.

Preferably, the sputtering step may comprise applying a plasma or carrying out ion etching.

For example, regarding the sputtering step, the material apt to enable the member to be grown by electrolysis may be a material the sputtering threshold of which is lower than a preset threshold (for example 50 to 100 eV for a material based on silver with argon as the gas) under a given gas such as argon, materials such as silver, gold, copper and palladium being good candidates.

In particular, in the context of the first variant, in FIG. 2B, the material 1003*b* apt to promote the electrolysis—therefore the growth of the member—is resputtered, in the form of a thin (few nanometers to a few tens of nanometers thick) electrically conductive layer portion 1003*c*, onto the lateral flank 1002*b* of the initial blind hole (FIG. 2A) in such a way that it exhibits a thickness gradient that decreases with distance from the bottom of the hole towards the external side of the hole (this thin layer may or may not reach the side of said hole). In other words, the growth-promoting material may extend over the walls of the mask 1004 towards the aperture of the blind hole. Next, the electrolysis allows one or more additional layers 1007 to be grown with a view to obtaining the electrically conductive member. This principle also applies to FIG. 6B which shows the layer portion 1003*c* and these additional layers 1007. Although not shown, the same principle may apply to the bottom 1002*a* in FIG. 1, which is formed by the electrolysis promoting material.

According to one variant, the bottom 1002 of the blind hole 1001, at least in a central portion, is formed by a layer 1003*b* of a material that prevents said growth (this enabling the rest of the internal surface of the blind hole to promote said growth of the member). In this case, the growth rate is uniform but in contrast the masking of a portion of the hole also makes it possible to promote this growth in the unmasked zones and as a result the growth is therefore faster at the base of the lateral flank of the blind hole than on the rest of said lateral flank.

Thus, according to this variant it is possible to mask one portion of the bottom in order to enable growth beyond the mask.

Alternatively, and in a way that is combinable with the variant described above, it is possible to sputter or resputter the growth-enabling material in order to modify the properties of the material in a zone 1003*c* in FIG. 6B (see the alternative described above in which an insulating material 1003*c* is sputtered) in which it is desired to prevent the growth.

Generally, the embodiments associated with FIGS. 6A and 6B may also be applied in the case of one or more blind holes such as shown in FIGS. 2A and 2B.

It will be understood from the above description that all or only a portion of the member may be formed in the growth step. When only a portion of the member is formed by the growth step, the step of forming the member may comprise, after growth of said portion of the member, a step of forming a stack 1006 of one or more layers 1007 (FIGS. 2B, 6A, 6B) on said portion of the member in order to form the rest of said member such that the top of said stack bounds said cavity.

For example, by way of illustration of this stack-based embodiment, the bottom 1002a and at least one portion of the internal lateral flank 1002b (FIG. 6A) of the blind hole 1001 may be formed by the material promoting growth of the member. In this case, the step of forming the member initially comprises modifying the form of the bottom of the blind hole and of said at least one portion of the internal lateral flank 1002b (forming the base described above), especially by electrolysis of nickel. This modification allows a seed of the general shape of the member to be formed. Next, a stack 1006 of one or more layers 1007 is produced from the seed.

Preferably, the process comprises a step of freeing the member 1, comprising removing all or some of the structure 1000. The substrate may consist of a carrier of an electronic component, or the member may be completely free so as to be placed on a carrier of an electronic component separate from the substrate that was used to produce it.

It follows from what was said above that the invention also relates to an electrically conductive member for an electronic component obtained by the process such as described above. The member then comprises a first end E1 and a second end E2 opposite the first end E1, said second end comprising the cavity 2 (FIGS. 7 to 10).

Furthermore, the invention also relates to an electrically conductive member 1 for an electronic component extending between a first end E1, intended to make contact with a carrier, and a second end E2 opposite the first end E1. This member 1, which is preferably obtained according to the process such as described above, is equipped with a cavity 2 formed at the second end E2 and a solid body 3 extending between the first end E1 and the bottom 4 of the cavity 2, the body 3 having a height h1 of at least 10% of the maximum total height h2 of the member 1. A rim 5 borders all or some of the cavity 2 (FIGS. 7 to 10). The maximum total height $h_2$ may be defined as the maximum distance separating distal points of the ends E1 and E2.

The height $h_1$ may be comprised between 10% and 90% of the maximum total height $h_2$, and is preferably equal to or about 60% of $h_2$. Of course, the height $h_1$ of the body 3 remains compatible with the presence of the cavity 2, in other words it may not reach 100% of the height $h_2$ of the member 1. Preferably, the depth of the cavity 2 is smaller than the height $h_1$ of the body. A body 3 of these dimensions has a stability that is satisfactory with respect to preventing the member 1 from degrading when the latter is stressed at its second end E2 while its first end E1 it is fixed to a carrier. Advantageously, these two heights $h_1$ and $h_2$, and the depth of the cavity, are oriented along an axis A1 passing through the two ends E1 and E2.

Preferably, the maximum total height $h_2$ of the member 1 is comprised between 3 μm and 50 μm and the height $h_1$ is comprised between 2 μm and 40 μm.

According to one particular embodiment, the height $h_1$ is equal to 12 μm and the height $h_2$ is equal to 18 μm.

In fact, the member 1 extends between its first and second ends E1, E2 along the axis A1, this axis lying substantially perpendicular to a plane including the first end E1 and a plane including the second end E2.

As illustrated in FIGS. 7 to 10, the rim 5 advantageously has a bevelled shape.

In particular, said rim 5 comprises at least two opposite side sections 5a, 5b that are preferably substantially parallel. In FIG. 7, the cavity 2 is bounded by a groove that is open at its two ends, the bottom of the groove forming the bottom of the cavity 2. Moreover, two oblique facets of the groove extend and diverge from the bottom of the groove in order to bound the two side sections 5a, 5b of the rim 5.

In a particular embodiment illustrated in FIG. 8, the cavity 2 is bounded by a negative imprint of a pyramidal with a truncated top, the base of which possesses four sides forming the edge of the rim 5. The faces of this pyramid converge toward the first end E1. Although this is not shown, the negative imprint could also not be with a truncated top. More generally, this negative imprint may be compared to a groove closed at its two ends.

In FIGS. 7 and 8, the two sections 5a, 5b each bound, with the rest of the member, two bevelled portions. These two portions facilitate penetration of the member 1 into a third element.

In one particular embodiment illustrated in FIG. 9, the cavity 2 is bounded by a negative imprint of a conical with a truncated top, the base of which forms the edge of the cavity 2. The cone converges towards the first end E1. Although this is not shown, the negative imprint could also not be with a truncated top. In this embodiment, between its two ends E1 and E2, the member 1 is bounded by a cylinder and is equipped with a single ring-shaped bevel.

According to one particular embodiment the rim 5 comprises an edge forming a ring entirely contained in a plane. Thus it will be understood that the rim 5 borders the whole cavity. In the embodiments in FIGS. 8 and 9, this edge forms the side of the cavity 2.

Preferably, the cross section of the member in a plane of intersection substantially perpendicular to the axis A1 may be rectangular (FIGS. 7 and 8), oval or disc-shaped (FIG. 9), the cross section may depend on the shape of the associated blind hole. Other more complex shapes could also be produced, in particular, if the cross section is a polygon, the negative imprint will possibly also be a pyramid the base of which is a polygon.

As mentioned above, the member is electrically conductive, this electrical conductivity allows it to form an electrical connection member. The member may be made of one of the materials mentioned regarding the manufacturing process.

Figure 11:
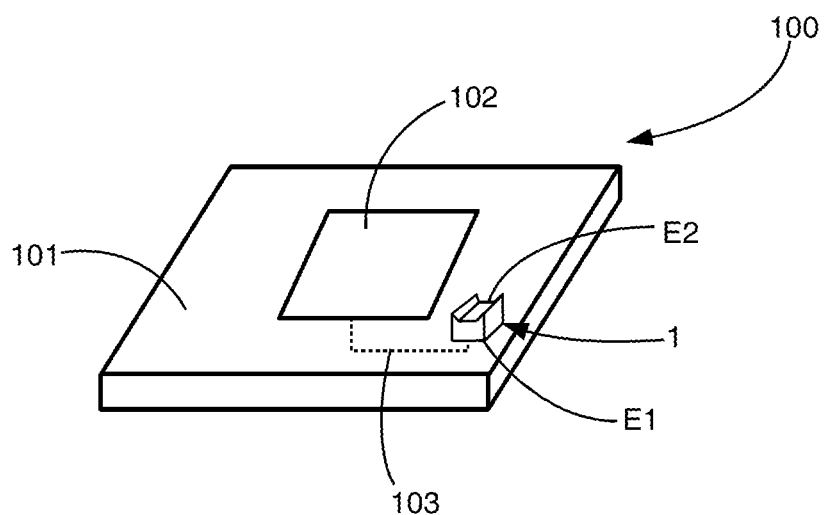
FIG. 11 illustrates a particular embodiment of an electronic component according to one implementation of the invention.

The invention also relates to an electronic component. FIG. 11 illustrates such a component 100. The electronic component 100 comprises a carrier 101 and a member 1 according to one of the embodiments described above and extending from the carrier 101, starting from its first end E1, in a direction opposite to said carrier (the second end E2 is therefore a distance away from the carrier 101). Of course, the component may also comprise a plurality of members such as described.

Advantageously, the carrier 101 is equipped with an electronic chip 102 and the member 1 forms an electrical connection pad connected electrically to the chip 102 especially via the first end E1 of said member 1. This electrical connection may be obtained with any type of connection element 103 such as represented by the dotted lines in FIG. 11. In this case, all or only a portion of the member 1 may be electrically conductive.

In the present description, the expression "electronic chip" is in particular understood to mean any passive or active electronic structure comprising one or more electrical connections.

Figure 12:
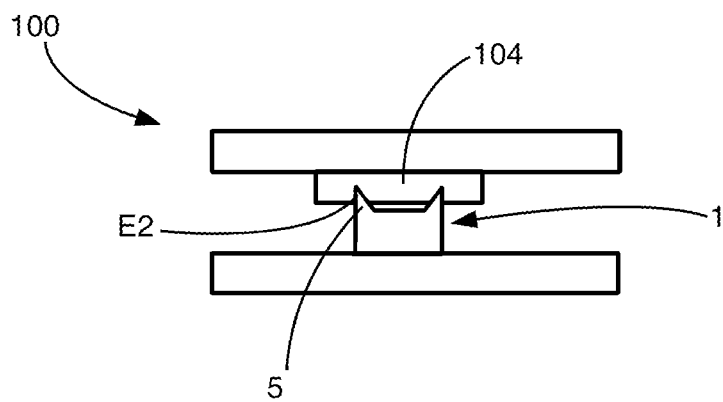
FIG. 12 illustrates one possible use of the member in an electronic component.

Preferably, the second end E2 of the member 1 makes, as illustrated in FIG. 12, electrical contact with an electrically conductive element 104 of the electronic component 100. For example, all or some of the rim 5 penetrates into the electrically conductive element 104 so as to ensure an electrical contact with said corresponding member 1. It will be understood that the end E2 of the member 1 allows an intimate contact to be formed with the electrically conductive element 104.

According to one embodiment, the cavity 2 of the member 1 advantageously allows the electrically conductive element 104 to be associated with said member 1 to be aligned or centred.

Preferably, the electrically conductive element 104 is less hard than the member 1 so that the member 1 (and especially the edge 5 of the member 1) is able to penetrate into the electrically conductive element 104 without degrading. There may also be a partial degradation of the member and/or the electrically conductive element in the regions of contact of said member and element.

Figure 13:
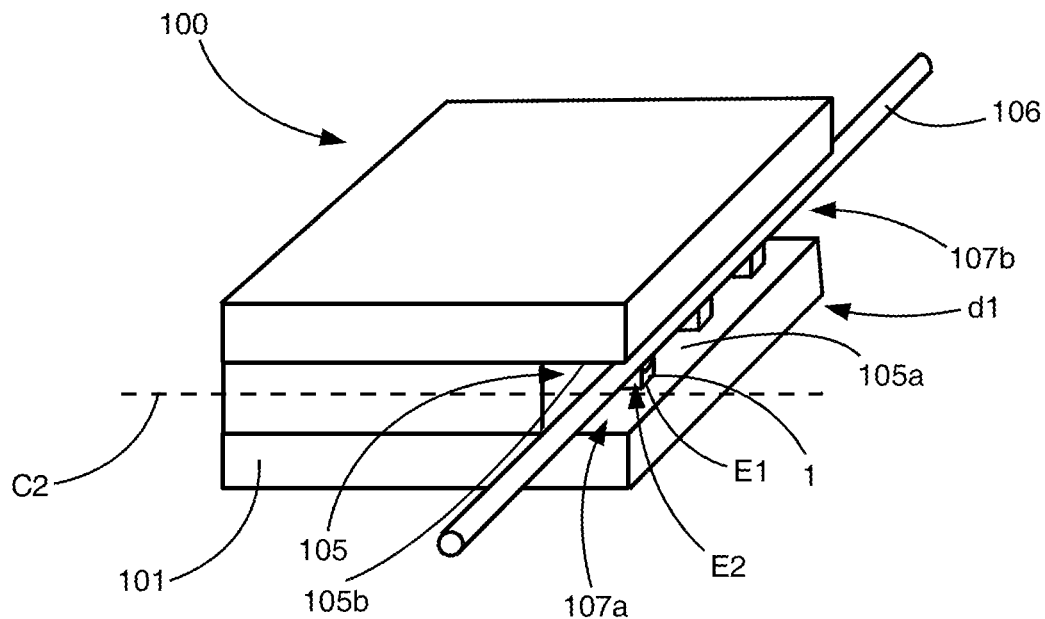
FIG. 13 is a perspective view of a particular embodiment of the electronic component with a groove for anchoring a wire element.
Figure 14:
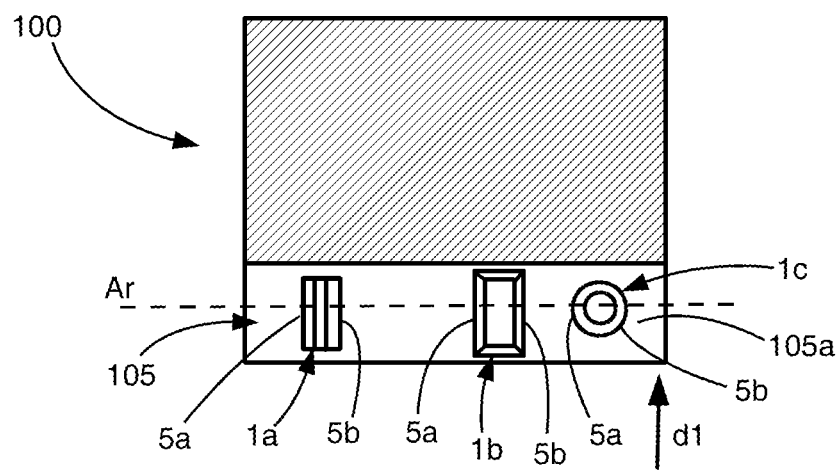
FIG. 14 is a cross-sectional view along C2 in the plane of the anchoring groove of the component in FIG. 13.

According to one particular implementation, illustrated in FIGS. 13 and 14, the electronic component 100 comprises a groove 105 for anchoring an electrically conductive element 106 (like a wire). The member 1 extends, starting from its first end E1, from a first side wall 105a of the groove 105 formed by a portion of the carrier 101. The second end E2 of the member 1 faces a second side wall 105b of the groove 105. In other words, the second side wall 105b of the groove 105 comprises at least one portion placed plumb with the second end E2. Preferably, the first side wall 105a and the second side wall 105b are substantially parallel to each other. The groove 105 is advantageously open at its two ends 107a and 107b. The space left between the second end E2 and the second side wall 105b of the groove 105 is intended for anchoring the wire element 106. When it is anchored, the wire element 106 forms an integral part of the electronic component 100, it may then be compared to the electrically conductive element 104 described above.

Preferably, the first and second side walls 105a, 105b of the groove 105 extend along a groove axis $A_r$ (shown in FIG. 14 and substantially parallel to the wire element 106 shown in FIG. 13) the two opposite sections 5a, 5b of the member 1 being spaced out along the groove axis $A_r$ and arranged perpendicular, or oblique, to said groove axis $A_r$. This makes it possible to facilitate the penetration of the member into the wire element 106 when said wire element 106 is being anchored in the groove 105 along an anchoring direction dl lateral to the groove 105, while ensuring the member 1, by virtue of the stability provided by its body, is satisfactorily resistant to the shear stresses induced during the anchoring operation. Although the three members 1a, 1b, 1c shown in FIG. 14 illustrate that the members in FIGS. 7 to 9 may be used alone or in combination, it is preferable to use the member in FIG. 7, the cavity 2 of which is bounded by an open groove facilitating the anchoring of the wire element via two groove end points.

In FIG. 13, the wire element 106 is pinched between the second end E2 of the member 1 and the groove side wall 105b opposite the groove side wall 105a starting from which said member 1 extends. Although the forces exerted by the pinching of the wire element 106 between the member 1 and the groove side wall 105b are enough to keep the wire element 106 assembled with the rest of the electronic component, the groove 105 may advantageously be filled with an electrically insulating or electrically conductive material intended to reinforce said assembly.

In the present description, the expression "substantially parallel" may be understood to mean exactly parallel or parallel to within plus or minus 10 degrees.

In the present description, the expression "substantially perpendicular" may be understood to mean exactly perpendicular or perpendicular to within plus or minus 10 degrees.

As was described above, it is possible to align or centre an electrically conductive element 104 with the member such as described. More generally, the electrically conductive member may also be used as a tool for aligning any third element (whether it is electrically conductive or not), especially in the field of microelectronics. Such a third element may be a ball or even a male element (whether it is electrically conductive or not) such as described in patent application FR 2 967 296, said male element penetrating into a female element formed, in the present case, by said electrically conductive member.

The invention claimed is:

1. Electronic component comprising a carrier and an electrically conductive member equipped with a first end and a second end opposite the first end, said second end comprising a cavity, said member extending from the carrier starting from its first end in a direction opposite to said carrier, said carrier being equipped with an electronic chip, the member forming an electrical connection pad that is electrically connected to the chip especially via the first end of said member,
    wherein the member is equipped with a solid body extending between the first end and the bottom of the cavity, the body having a height of at least 10% of the maximum total height of the member, and wherein a rim borders all or some of the cavity.

2. Component according to claim 1, wherein said rim has a bevelled shape.

3. Component according to claim 1, wherein said rim comprises at least two opposite and preferably substantially parallel side sections.

4. Component according to claim 1, wherein the rim comprises an edge forming a ring entirely contained in a plane.

5. Component according to claim 1, wherein the second end of the member makes electrical contact with an electrically conductive element.

6. Component according to claim 5, wherein the electrically conductive element is penetrated by all or some of the rim so as to ensure electrical contact with said corresponding member.

7. Component according to claim 1, wherein the component comprises a groove for anchoring an electrically conductive wire element, and wherein the member extends starting from its first end from a first side wall of the groove formed by a portion of the carrier, said second end of the member facing a second side wall of the anchoring groove.

8. Process for manufacturing an electronic component, wherein the process comprises:
    providing a structure comprising at least one blind hole having a bottom and at least one internal lateral flank connected to said bottom via a base of said lateral flank;
    forming an electrically conductive member, the forming comprising growing an electrically conductive material in order to form at least one portion of the member in the blind hole, said growth being faster at the base of the lateral flank of the blind hole than on the rest of said lateral flank, said member when formed comprising a cavity arranged at the end of said member which is located opposite the bottom of the blind hole, said cavity being entirely or partially bordered by a rim, so as to obtain the electronic component according to claim 1.

9. Process according to claim 8, wherein the growing involves carrying out an electrolysis or a chemical deposition.

10. Process according to claim 8, wherein the providing of the structure comprising said at least one blind hole comprises:
providing a substrate;
forming a mask on the substrate so that said mask bounds with said substrate said at least one blind hole.

11. Process according to claim 8, wherein all or some of the bottom of the blind hole, and/or at least the base of the lateral flank are formed by a material apt to promote said growth.

12. Process according to claim 8, wherein the bottom of the blind hole, at least in a central portion, is formed by a layer of a material that prevents said growth.

13. Process according to claim 8, wherein the bottom of the blind hole is formed by a material apt to enable the member to be grown by electrolysis, and wherein the forming of the member comprises, before the growing, sputtering some of the material apt to enable the member to be grown by electrolysis onto at least the base of the internal lateral flank of the blind hole, and wherein the growing is carried out by electrolysis after the sputtering.

14. Process according to claim 13, wherein the sputtering comprises applying a plasma or carrying out ion etching.

15. Process according to claim 9, wherein the electrolysis is based on nickel or gold or copper or tin or an alloy of at least two of these metals.

16. Process according to claim 8, wherein the forming of the member comprises, after the portion of the member has been grown, forming a stack of one or more layers on said portion of the member in order to form the rest of said member in such a way that the top of the stack bounds said cavity.

17. Process according to claim 8, wherein the process comprises freeing the member, comprising removing all or some of the structure.

18. Process according to claim 11, wherein the material apt to promote said growth takes the form of a layer.

* * * * *